United States Patent
Levy et al.

(10) Patent No.: US 6,464,554 B1
(45) Date of Patent: Oct. 15, 2002

(54) NON-MECHANICAL CONTACT TRIGGER FOR AN ARTICLE

(76) Inventors: Richard C. Levy, 6737 Newbold Dr., Bethesda, MD (US) 20817; Robert W. Jeffway, Jr., 37 Front St., Leeds, MA (US) 01053

( * ) Notice: Subject to any disclaimer, the term of this patent is extended or adjusted under 35 U.S.C. 154(b) by 137 days.

(21) Appl. No.: 09/618,801

(22) Filed: Jul. 18, 2000

(51) Int. Cl.[7] .............................................. A63H 33/30
(52) U.S. Cl. ...................... 446/144; 446/175; 446/406; 446/473; 250/221
(58) Field of Search ............................. 250/221; 42/84, 42/99, 69.01; 89/28.05, 135, 136; 446/144, 175, 219, 405, 406, 473

(56) References Cited

U.S. PATENT DOCUMENTS

| | | |
|---|---|---|
| 3,214,507 A | 10/1965 | Williams |
| 3,526,775 A | 9/1970 | Freidrich et al. |
| 3,558,793 A | 1/1971 | Nakada et al. |
| 4,134,223 A | 1/1979 | Hillenbrandt et al. |
| 4,344,346 A | 8/1982 | Erickson et al. |
| 4,429,607 A | 2/1984 | Meno |
| 4,486,807 A * | 12/1984 | Yanez ......................... 361/232 |
| 4,757,491 A | 7/1988 | Koike |
| 4,757,629 A | 7/1988 | Austin |
| 4,813,907 A | 3/1989 | Rissman et al. |
| 4,968,877 A | 11/1990 | McAvinney et al. |
| 5,081,896 A | 1/1992 | Hiyoshi et al. |
| 5,541,397 A * | 7/1996 | Walts ......................... 250/221 |
| 5,637,996 A | 6/1997 | McDarren et al. |
| 5,668,333 A | 9/1997 | Horton et al. |
| 5,803,453 A | 9/1998 | Stephan et al. |

OTHER PUBLICATIONS

"Barney Song Magic Banjo" (Admitted Prior Art).

* cited by examiner

*Primary Examiner*—Jacob K. Ackun
(74) *Attorney, Agent, or Firm*—Nixon & Vanderhye

(57) ABSTRACT

An article, for example, a toy weapon, has a hand grip provided with a trigger zone. The trigger zone is divided into first and second trigger zone portions forwardly of the hand grip and in a common plane therewith. A light source emits a light beam across the second trigger zone portion for reception by a receiver coupled through a microprocessor to electronic devices affording auditory and/or visual responses to interruption of the visible light beam when an individual pulls a trigger finger back toward the hand grip interrupting the light beam.

13 Claims, 4 Drawing Sheets

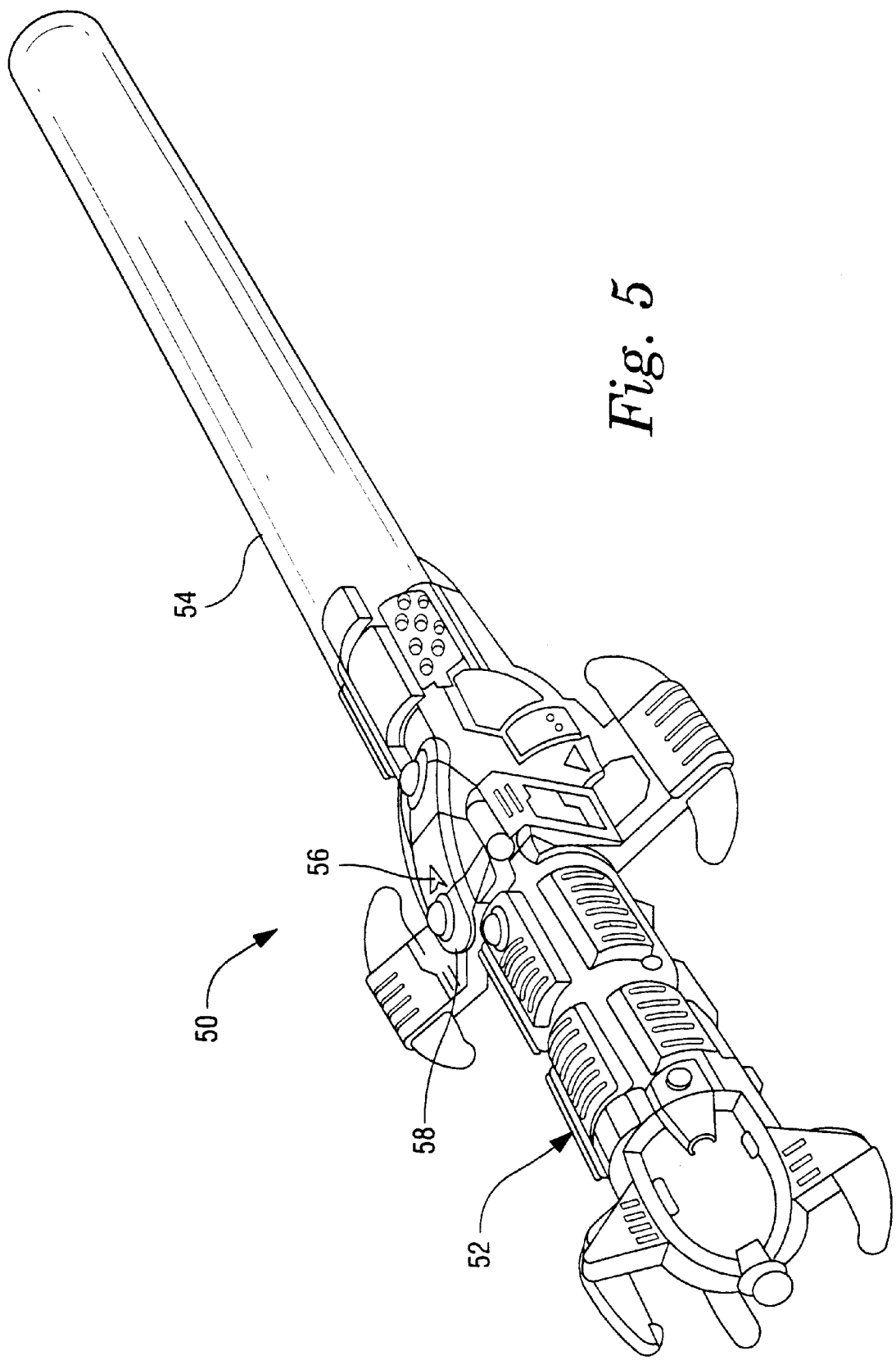

NON-MECHANICAL CONTACT TRIGGER FOR AN ARTICLE

TECHNICAL FIELD

The present invention relates to a trigger for an article and particularly to a non-mechanical trigger for actuating the article without physical contact between a trigger finger and the article.

BACKGROUND

There are many types of articles which are actuated by a mechanical trigger requiring physical contact between a individual's index finger and the trigger per se typically to displace the trigger toward a hand grip. Examples of this type of trigger actuation include hand-held power tools, guns, electronic games, to mention but a few. The present invention is primarily directed to weapons, for example, guns, particularly toy guns, and is described herein with reference to weapons or guns. It will be appreciated, however, that the trigger hereof has diverse applicability to other types of articles requiring trigger actuation, such as those mentioned above and others.

In a typical weapon for example a hand gun, there is provided a hand grip, a barrel, and a trigger assembly for firing the gun. The individual's hand conventionally extends or grasps about the handle grip and a portion of the individual's index finger is typically extended into a trigger guard housing a mechanical trigger. The individual's index finger is naturally positioned forwardly of the trigger and within the trigger guard by grasping the hand grip such that the index finger can be pulled back to displace the trigger and fire the weapon. In the toy or simulated weapons industry, a similar arrangement is conventionally provided. In both cases, the mechanical trigger is contacted by the individual's index finger and drawn back to fire or actuate the gun or toy weapon which then provides a sensory response. For example in the case of an actual hand gun, the firing of the gun is accompanied by an auditory signal that the gun has been fired. In the toy industry, various visual and auditory sensory responses are typically provided when the individual draws back the trigger. For example, sounds may be generated and emitted simulating the firing of a real gun. The sounds may be repeated simulating the firing of an automatic weapon. Other and different types of auditory sounds may be used.

Additionally, visual sensory responses for example the actuation of lights or the firing of a projectile such as the Nerf ball, dart or the projection of a stream water as in the case of a water gun, may be provided. It will be appreciated that there is a wide variety of auditory and/or visual sensory responses that can be generated using trigger assemblies in various environments. As additional examples, actuation of a trigger can control the movement of a toy race car. The handle of a toy sword can be provided with a trigger whereby the sword can generally project light or a light beam. Some machines, e.g., in amusement parks, often employ triggers to actuate or control a game. Trigger actuation is quite common for actuation of many different articles.

DISCLOSURE OF THE INVENTION

In accordance with a preferred embodiment of the present invention, there is provided a trigger for actuating an article affording a visual or auditory sensory response without mechanical contact between the individual's actuating finger and the mechanism. Particularly, and in a preferred embodiment of the present invention, a trigger zone is provided having forward and rearward trigger zone portions, preferably forwardly of a hand grip. The rearward zone portion lies between the forward zone portion and the hand grip in a location in which would otherwise typically lie an actuating trigger. In lieu of a mechanical trigger, a light source and light receiver are carried by the article. The light source projects a beam of light through the rear trigger zone portion for reception by the light receiver. Electronic means are provided coupled to the light receiver. The electronic means is responsive to interruption of the light beam by movement of an individual's finger from the forward trigger zone through the rearward trigger zone to provide a visual or auditory sensory response. The fight beam, in effect, takes the place of the mechanical trigger. Preferably, the natural positioning of the individual's hand about the hand grip enables a natural positioning of the individual's index finger in the first trigger zone spaced from and preferably forwardly of the light beam and extending in a direction generally normal to a plane containing the hand grip and trigger zones. Consequently, the movement of the index finger in a direction toward the hand grip interrupts the visible light beam enabling a microprocessor forming part of the electronic means to provide an auditory and/or visual sensory response to the interruption of the beam. Additional sensory responses may be provided upon removal of the individual's finger reestablishing the light beam in the trigger zone. For example, the first auditory or visual sensory response may be turned off or turned off after a predetermined time period has elapsed. An additional light beam can also be provided to provide different auditory and/or visual sensory responses upon its interruption by the individual's finger. For example, interruption of the first light beam in a toy gun may simulate a single shot or a single firing of a water stream over a very short duration while interruption of the second light beam may simulate the sounds of automatic weapon fire or projection of a water stream over a longer period of time.

In a preferred embodiment according to the present invention, there is provided a gun comprising a gun frame having a trigger zone with forward and rearward trigger zone portions, the forward zone portion being located along the frame for placement of a portion of an individual's index finger in a direction generally normal to a direction of aim of the gun, a light source and a light receiver carried by the gun frame, the light source projecting a beam of light through the rearward trigger zone portion for reception by the light receiver and electronic means coupled to the light receiver and responsive to interruption of the light beam by movement of the individual's finger from the forward trigger zone portion to the rearward trigger zone portion to provide a visual or auditory sensory response.

In a further preferred embodiment according to the present invention, there is provided a toy comprising a toy body having a hand grip and a trigger zone, the trigger zone having first and second trigger zone portions spaced forwardly of and lying in a common plane with the hand grip, the second trigger zone portion lying between the hand grip and the first trigger zone portion, the toy body including a light source for projecting a discrete beam of light through the second trigger zone portion and a light receiver for receiving the light beam, the hand grip and the first trigger zone portion being located and configured relative to one another to enable a natural positioning of the individual's index finger in the first trigger zone portion and extending in a direction generally normal to the plane when the individual's hand extends about the hand grip and electronic means coupled to the light receiver and responsive to interruption of the light beam by movement of the individual's index finger from the first trigger zone portion to the second trigger zone portion to provide the individual with a visual or auditory sensory response.

In a still further preferred embodiment according to the present invention, there is provided a toy comprising a toy body having a hand grip and a projection from the hand grip simulative of a sword blade, a trigger zone adjacent the sword grip and including a light source and a light receiver, the light source projecting a beam of light through the trigger zone for reception by the light receiver, one of the light source and the light receiver being spaced from the hand grip and another of the light source and the light receiver being located adjacent the hand grip and electronic means coupled to the light receiver and responsive to interruption of the light beam by movement of the individual's finger through the trigger zone to provide a visual or auditory sensory response in the sword.

BRIEF DESCRIPTION OF THE DRAWING

FIG. 5 is a schematic representation of a sword incorporating a trigger constructed in accordance with a preferred embodiment of the present invention.

BEST MODE FOR CARRYING OUT THE INVENTION

Figure 1:
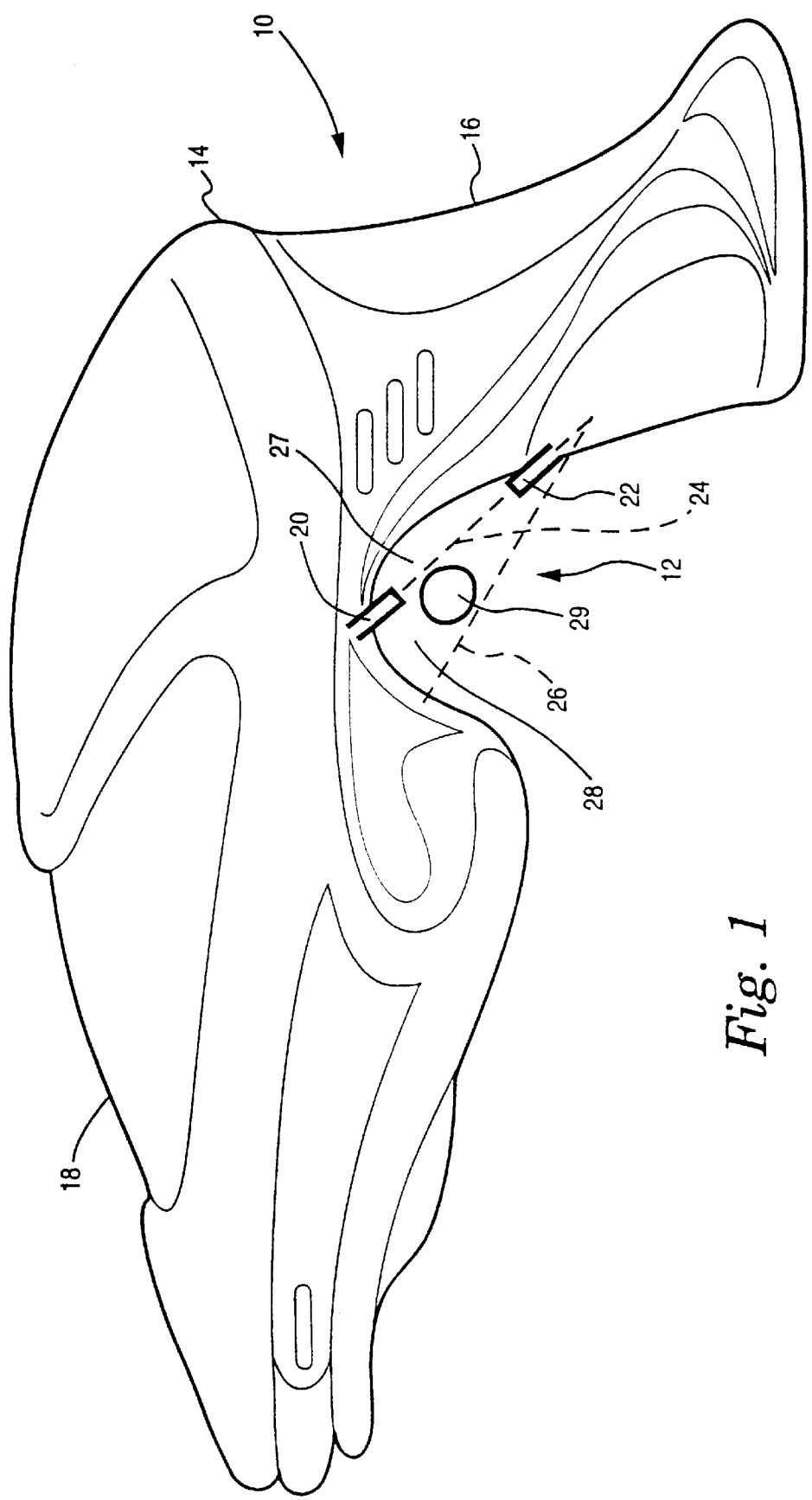
FIG. 1 is a schematic illustration of an article, e.g., a toy gun illustrating a trigger constructed according to a preferred embodiment of the present invention.
Figure 4:
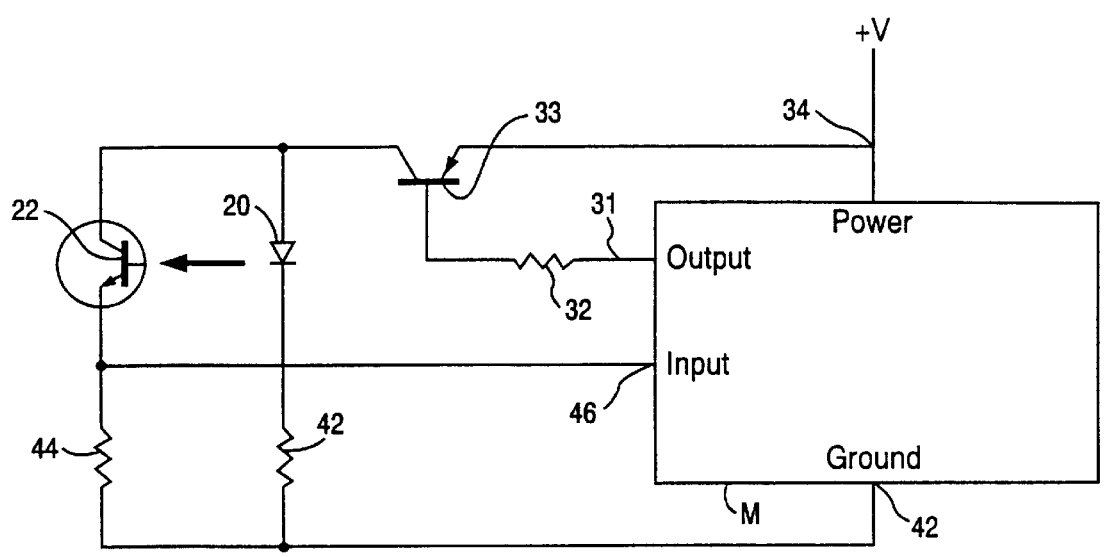
FIG. 4 is a schematic representation of electronic circuitry for providing auditory or visual sensory responses upon actuation of the trigger.

Referring now to FIG. 1, there is illustrated an article generally designated 10 containing a trigger generally designated 12 constructed according with the present invention. The article 10 as illustrated in FIG. 4 is in the form of a toy or simulated hand gun. However, it will be appreciated that the air trigger hereof has application to other types of articles, e.g., as noted above. As illustrated in FIG. 1, the hand gun includes a gun frame 14 having a handle or hand grip 16 and a barrel 18 simulating an actual gun but which affords auditory and/or visual sensory to perceptions when the trigger as explained below is activated.

The trigger 12 comprises, in a preferred form of the present invention, a light beam projected by a light emitting diode 20 onto a light receptor 22. As illustrated, the light emitting diode 20 is located along the gun frame 14 in the upper section of a trigger zone 26 and the light receptor 22 is located along the forward face of the handle 16. The light emitting diode 20 emits a light beam which is received by the light receptor 22. The beam of light indicated 24 may be visible or invisible light, such as infrared, and traverses a rearward trigger zone portion 27 of trigger zone 26. A forward trigger zone portion 28 lies in the trigger zone 26 forwardly of the rearward trigger zone portion 27 and in a plane common to the trigger zone portion 27 and handle 16. It will be appreciated that the trigger zone 26 generally conforms to the trigger area of a conventional hand gun but as illustrated does not have a mechanical trigger or any other physical parts in that zone. The forward trigger zone portion 28 is that portion of the trigger zone in which an individual's index finger will naturally extend or reside when grasping his/her hand about the handle 16. That is, when the individual's hand is extended about the handle 16, the natural positioning of the individual's index finger is in the first or forward trigger zone portion spaced forwardly of the visible light beam 24. Note that the individual's index finger lies in this natural position (represented by the circle 29 in drawing FIG. 1) when the individual's hand grasps naturally about the hand grip 16.

It will be appreciated that the actuation of an article, e.g., the simulated firing of a toy gun, is accomplished by pulling back the individual's index finger 30 to interrupt the light beam 24 between the light emitting diode 20 and the light receiver 22. This is identical to the individual's action when pulling back a trigger where physical contact occurs between the individual's index finger and an actual mechanical trigger. As explained below, the interruption of the light beam causes auditory and/or visual sensory responses indicating activation of the article. For example, interruption of the light beam by "firing" the gun may cause a discrete sound simulative of an actual firing of a gun or may cause a mechanism of the gun, not shown, to shoot a dart, activate a water gun, project a light beam or the like. It will be appreciated that a wide variety of responses to the passage of the individual's finger from the forward trigger zone portion into the rearward trigger zone portion interrupting the light beam can be provided. Other types of responses, e.g., might be the actuation of a visible indicator light. Various combinations of light and sound effects can also be provided as those skilled in the art will recognize.

Referring to FIG. 4, there is illustrated an electronic circuit for enabling the trigger and providing a response to actuation of the trigger. Particularly, the circuit illustrated in FIG. 4 provides an air trigger enable signal 31 from a microprocessor M connected to the base of a PNP transistor 33 through resistor 32. The emitter of transistor 33 is connected to +voltage at 34. The collector of transistor 33 is connected to the collector of the light receiver, e.g., photo transistor 22 and to the anode of the LED 20. The cathode of the LED 20 is connected to ground through resistor 42. The emitter of the photo transistor 22 is connected to ground through resistor 44. The emitter of photo transistor 22 is also connected to the trigger input signal at 46 in the microprocessor M.

In operation, the air trigger enable signal 31 in the microprocessor M outputs a current through resistor 32 into the base of PNP transistor 33. When the trigger circuit is enabled, transistor 33 is turned on with this base current thereby connecting power 34 to the collector of photo transistor 22 and to the anode of LED 20.When transistor 33 is turned on, the LED 20 emits a beam of light that is sensed by the, photo transistor 22. The beam of light may be of any color, e.g., red, orange, yellow, A green or the like and may be a visible or invisible light beam. The light emitted from the LED 20 that is sensed by photo transistor 22 turns on the base of photo transistor 22 thereby permitting a current flow through photo transistor 22. The current flow through transistor 22, at least partially flows through resistor 44, thereby forcing the voltage at the emitter of photo transistor 22 to a first voltage level. This voltage is sensed by the trigger input signal 46 of microprocessor M. When the light from the LED is interrupted or blocked, the current into the base of photo transistor 22 is turned off. Thus, no current flows through photo transistor 22 and the voltage at the emitter photo transistor 22 becomes the voltage at ground. This voltage state is detected by the microprocessor M at trigger input 46 and auditory and/or visual sensory responses are provided for example using a sound chip. When the trigger circuit is not enabled, such as when the toy is "off", no current is output to the base of transistor 33 via resistor 32, thereby effectively disconnecting the power source at 34 from the collector of photo transistor 22 and the anode of the LED 20. In this state, the circuit is effectively disabled. When the trigger circuit is enabled, a current is applied to the base of transistor 33. In this state, the power output at 34 is electrically connected to both the collector or photo transistor 22 and the anode of the LED 20.

Figure 2:
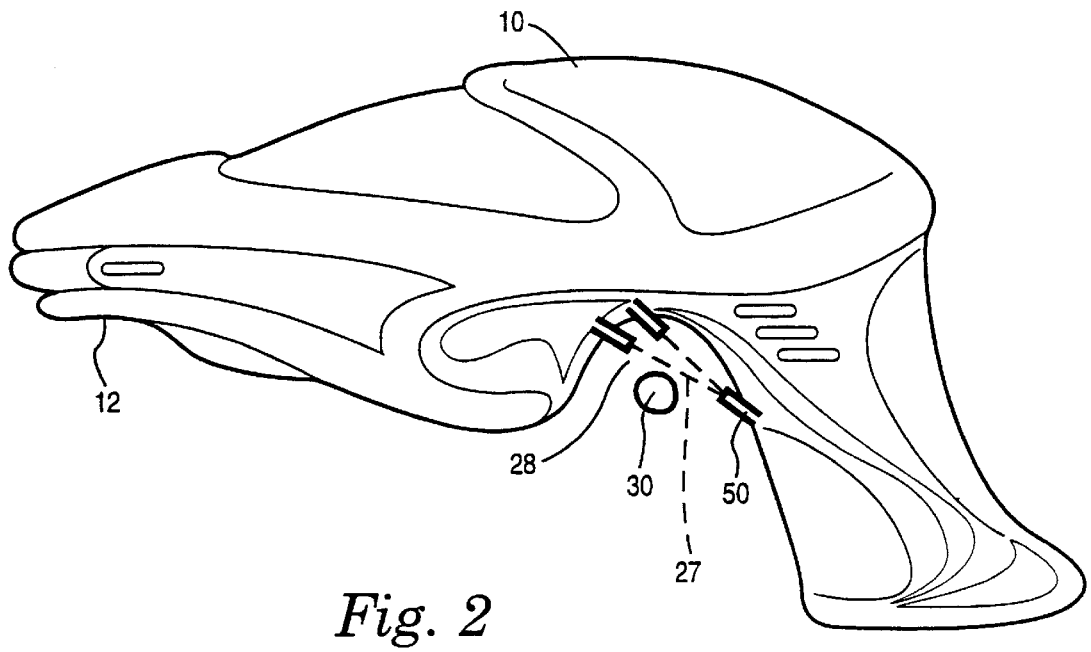
FIG. 2 is a schematic illustration of a further form of trigger hereof.

Referring to FIG. 2, there is illustrated another form of an air trigger according to the preferred embodiment of the present invention. In this form, the gun frame mounts the light emitting diode 20 and the light receiving photo transistor 22 on the same side of the second trigger zone. A light reflector 50 is disposed at the opposite side of the second or rearward trigger zone portion 27. Thus the light emitted from the light emitting diode 20 forms a light beam directed to the reflector 50 and the reflector 50 reflects the light beam to the photo transistor 22 found adjacent the light emitting diode 20. Thus a pair of beams span the rearward trigger zone portion 27, interruption of one of which provides the aforementioned response in the trigger circuit.

Figure 3:
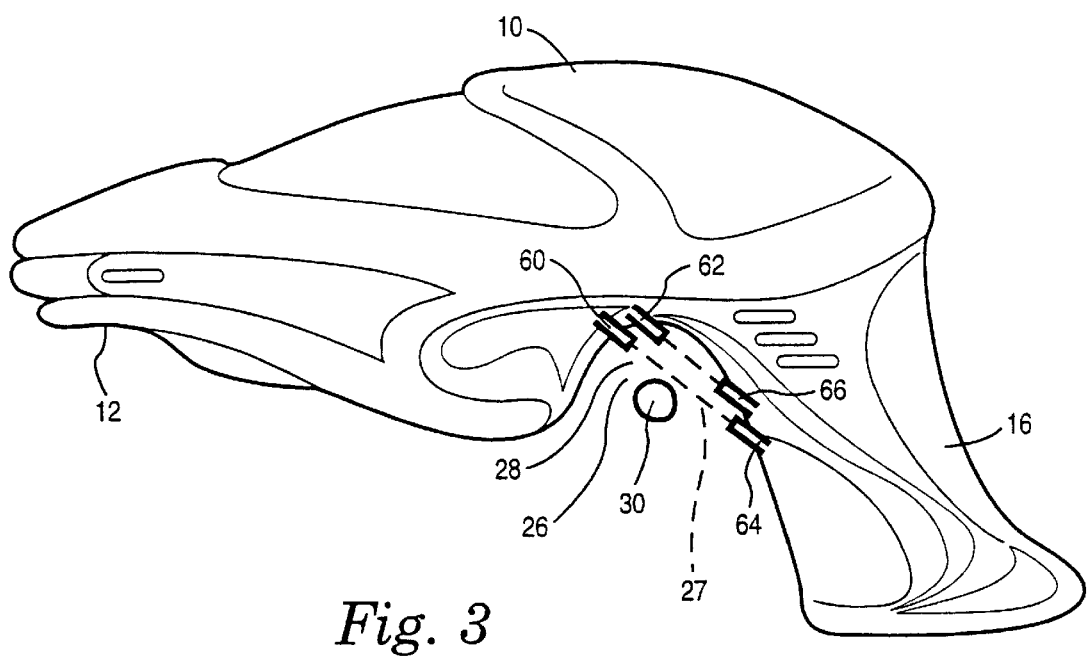
FIG. 3 is a view similar to FIG. 1 illustrating a still further form of the trigger.

Referring to FIG. 3, a pair of light emitting diodes 60 and 62 are mounted along the same side of the second trigger zone. A pair of light receiving photo transistors 64 and 66 are mounted adjacent the opposite side of the second trigger zone preferably colored. Accordingly when an individual trigger circuit is enabled, a pair of visible light beams extend across the second trigger zone portion 27 as illustrated by the dashed lines. The circuitry illustrated in FIG. 4 may be repeated with respect to the second LED and second light receiver. Different responses can be provided in response to interruption of the pair of beams. For example, when the trigger finger is moved rearwardly to interrupt the light beam first encountered in the second trigger zone portion 27, the response may be a single action for example a single auditory noise or the rapid actuation/deactuation of a light. When the finger interrupts the second beam, a continues reaction may be provided. For example a continuous noise may be heard or the light is maintained in an on condition until the finger is removed from the second trigger zone portion reinstating the second beam without interruption.

Referring to FIG. 5, there is illustrated a sword, generally designated 50, having a handle 52 and a simulated blade 54. The handle includes a guard 56 which is spaced laterally of the forward portion of the handle 52. The guard 56 and the forward portion of the handle spaced from and underlying the guard 56 mount one or the other of the light-emitting diode and light receptor, respectively. For example, a light-emitting diode similar to diode 20 of an earlier embodiment may be provided at the distal end 58 of the guard 56. Underlying the distal end 58 and on the forward portion of the handle 52 spaced from distal end 58, there is provided a light receptor similar to the light receptor 22 of the earlier embodiment.

The sword 50 may be provided with various visual or auditory responses, or both, upon actuation of the trigger. For example, one or more portions of the sword may light up or glow upon trigger actuation. The user of the sword 50 thus can grasp the sword by the handle 52 and insert a digit, i.e., a finger, between the distal end 58 of the guard 56 and the forward portion of the handle 52, interrupting-the light beam which, through a circuit, for example, as illustrated in FIG. 4, actuates the visual or auditory responses, or both. Thus, it will be appreciated that the distal portion 58 and the forward portion of handle 52 constitute a trigger zone having first and second trigger zone portions spaced one from the other, affording a light beam therebetween which, if interrupted by insertion of an individual's finger, actuates the sensor in response.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A gun comprising:
   a gun frame having a trigger zone with forward and rearward trigger zone portions, said forward zone portion being located along the frame for placement of a portion of an individual's index finger in a direction generally normal to a direction of aim of the gun;
   a light source and a light receiver carried by said gun frame, said light source projecting a beam of light through the rearward trigger zone portion for reception by said light receiver; and
   electronic means coupled to said light receiver and responsive to interruption of the light beam by movement of the individual's finger from said forward trigger zone portion to said rearward trigger zone portion to provide a visual or auditory sensory response;
   said light source and said light receiver being located on the gun frame on the same side of said rearward trigger zone portion, and a reflector on an opposite side of said rearward trigger zone portion for reflecting the light beam from said light source to said light receiver.

2. A gun according to claim 1 including a hand grip carried by said gun frame rearwardly of the trigger zone enabling a natural positioning of the individual's index finger in the first trigger zone portion spaced from the light beam and in a direction normal to the direction of aim of the gun when the individual extends a hand about the hand grip.

3. A gun according to claim 1 wherein said electronic means includes a microprocessor for processing a signal from said light receiver upon interruption of the light beam by the movement of the individual's finger for timing out the sensory response.

4. A gun according to claim 1 wherein said electronic means includes a microprocessor for processing a signal from said light receiver upon removal of the interruption of the light beam for causing a second auditory or visual sensory response.

5. A gun according to claim wherein said electronic means includes a microprocessor for processing a signal from the light receiver upon continued interruption of the light beam for causing another auditory or visual sensory response.

6. A gun according to claim 1 wherein said gun is a toy gun, said light beam traversing the rearward trigger zone at a location simulative of the location of a mechanical trigger for a gun.

7. A gun comprising:
   a gun frame having a trigger zone with forward and rearward trigger zone portions, said forward zone portion being located along the frame for placement of a portion of an individual's index finger in a direction generally normal to a direction of aim of the gun;
   a light source and a light receiver carried by said gun frame, said light source projecting a beam of light through the rearward trigger zone portion for reception by said light receiver; and electronic means coupled to said light receiver and responsive to interruption of the light beam by movement of the individual's finger from said forward trigger zone portion to said rearward trigger zone portion to provide a visual or auditory sensory response;

a second light source and a second light receiver being carried by said gun frame, said second light source projecting a second light beam through the rearward trigger zone portion at a location spaced from the first mentioned light beam for reception by said second light receiver, said electronic means coupled to said second light receiver and responsive to interruption of said second light beam by movement of the individual's finger into said second light beam to provide a second visual or auditory sensory response different than the first mentioned visual or auditory response.

8. A toy comprising:

a toy body having a hand grip and a trigger zone, said trigger zone having first and second trigger zone portions spaced forwardly of and lying in a common plane with said hand grip, said second trigger zone portion lying between said hand grip and said first trigger zone portion;

said toy body including a light source for projecting a discrete beam of light through said second trigger zone portion and a light receiver for receiving the light beam;

said hand grip and said first trigger zone portion being located and configured relative to one another to enable a natural positioning of the individual's index finger in the first trigger zone portion and extending in a direction generally normal to said plane when the individual's hand extends about the hand grip; and electronic means coupled to said light receiver and responsive to interruption of the light beam by movement of the individual's index finger from said first trigger zone portion to said second trigger zone portion to provide the individual with a visual or auditory sensory response;

said light source and said light receiver being located on the same side of said rearward trigger zone portion, and a reflector on an opposite side of said rearward trigger zone portion for reflecting the light beam from said light source to said light receiver.

9. A toy according to claim 8 wherein said toy body comprises a toy gun.

10. A toy according to claim 8 wherein said electronic means includes a microprocessor for processing a signal from said light receiver upon interruption of the light beam by the movement of the individual's finger for timing out the sensory response.

11. A toy according to claim 8 wherein said electronic means includes a microprocessor for processing a signal from said light receiver upon removal of the interruption of the light beam for causing a second auditory or visual sensory response.

12. A toy according to claim 8 wherein said electronic means includes a microprocessor for processing a signal from the light receiver upon continued interruption of the light beam for causing another auditory or visual sensory response.

13. A toy comprising:

a toy body having a hand grip and a trigger zone, said trigger zone having first and second trigger zone portions spaced forwardly of and lying in a common plane with said hand grip, said second trigger zone portion lying between said hand grip and said first trigger zone portion;

said toy body including a light source for projecting a discrete beam of light through said second trigger zone portion and a light receiver for receiving the light beam;

said hand grip and said first trigger zone portion being located and configured relative to one another to enable a natural positioning of the individual's index finger in the first trigger zone portion and extending in a direction generally normal to said plane when the individual's hand extends about the hand grip; and electronic means coupled to said light receiver and responsive to interruption of the light beam by movement of the individual's index finger from said first trigger zone portion to said second trigger zone portion to provide the individual with a visual or auditory sensory response;

a second light source and a second light receiver being carried by said toy body, said second light source projecting a second light beam through the rearward trigger zone portion at a location spaced from the first mentioned light beam for reception by said second light receiver, said electronic means coupled to said second light receiver and responsive to interruption of said second light beam by movement of the individual's finger into said second light beam to provide a second visual or auditory sensory response different than the first mentioned visual or auditory response.

* * * * *